United States Patent [19]
Jones

[11] Patent Number: 4,478,476
[45] Date of Patent: Oct. 23, 1984

[54] DIP BURN-IN SOCKET

[76] Inventor: Elmer R. Jones, 124 Chestnut St., North Reading, Mass. 01854

[21] Appl. No.: 369,479

[22] Filed: Apr. 19, 1982

[51] Int. Cl.³ .............................................. H01R 3/00
[52] U.S. Cl. ........................... 339/147 R; 324/158 F; 339/17 CF
[58] Field of Search .............. 339/17 CF, 179, 147 R; 324/158 R, 158 F

[56] References Cited
U.S. PATENT DOCUMENTS 3,754,203  8/1973  Pauza et al. ................... 339/17 CF
4,052,117  10/1977  Tengler et al. ................ 339/17 CF

OTHER PUBLICATIONS

"Test Contactor", H. P. Byrnes, IBM Tech. Discl. Bull., vol. 18, No. 10, 3-1976, p. 3233.

Primary Examiner—Eugene F. Desmond
Attorney, Agent, or Firm—Thompson, Birch, Gauthier & Samuels

[57] ABSTRACT

A socket adapted to receive an integrated circuit having a body with outer opposed walls, having upper edges and a plurality of substantially flat contacts biased to a closed position within the socket body. The leads of the integrated circuit to be tested engage the contacts. The contacts extend over the upper edge of the walls and are then turned downwardly to form a neck portion of reduced width compared to the width of the contact disposed within the socket 40.

4 Claims, 3 Drawing Figures

DIP BURN-IN SOCKET

BACKGROUND AND BRIEF SUMMARY OF THE INVENTION

Integrated test systems for component testing in a burn-in chamber are well known; for example, semiconductor life tests in burn-in chambers are common. The process of burning-in typically consists of applying a load to the components being tested as elevated temperatures. This allows indentification of weak or faulty components, and thus, precludes the ultimate use such as in a computer system. The burn-in chambers generally comprise a plurality of paired tracks which carry the burn-in trays, connectors and a power supply.

The burn-in trays typically comprise a pan and an integrated circuit board which board includes connectors, sockets, etc., secured thereto. The sockets may be longitudinally bussed to a ribbon plug as is well known. There may be positioned in the sockets any number of elements to be tested, for example, semi-conductor devices, integrated circuits, etc. With commercially available burn-in trays, a longitudinal circuit board containing sockets and associated components, such as resistors, is secured to the rectangular pan. The sockets are arranged in parallel rows transverse to the longitudinal axis of the board.

In the earlier boards commercially available, discrete resistors were connected to the contacts in the sockets and were simply layed on the boards in a flat position adjacent the sockets. Presently, in order to achieve a greater density of sockets on a tray, thus allowing a greater quantity of integrated circuits or the like to be tested at one time in one particular location in a burn-in chamber, the resistors are joined to the sockets in an upright vertical position allowing a greater number of sockets per unit area.

In these systems, where the resistors are upright, they are connected to individual contacts in the dip burn-in sockets. These contacts extend over the upper edge of the body of the socket and then extend downwardly and upwardly in side-by-side spaced relationship. In actuality, these contacts which are welded to one lead of an associated resistor are typically very close and rigid. This results in accidental dislodging of the contacts during loading and unloading of the IC's, whereby they may either break or be distorted resulting in shorting out or more generally, damage to the contacts.

The present invention is directed to a configuration of contacts in dip burn-in circuits which overcome the problems of high frequency damage and/or shorting endemic in prior art configurations.

Broadly, in my invention a socket adapted to receive an IC or the like, includes a body with outer opposed walls having upper edges and a plurality of substantially flat contacts biased to a closed position within the socket body to receive the leads of an IC to be tested. The contacts extend over the upper edge of at least one wall and then are turned downwardly forming a necked section of reduced width compared to the width of the contact disposed within the socket body. The contact terminates in a depending end having a concave surface adapted to engage a lead of an associated resistor.

The contact within the socket body is restrained from lateral movement by walls within the socket body. The reduction in width is approximately one-half, i.e., the necked portion compared to the width of the contact within the socket body. Alternatively, the contacts on both sides of the socket body are formed in a like manner. In a particularly preferred embodiment, the depending end is C-shaped and adapted to receive in frictional engagement the lead of a resistor.

DESCRIPTION OF THE PREFERRED EMBODIMENT

Figure 1:
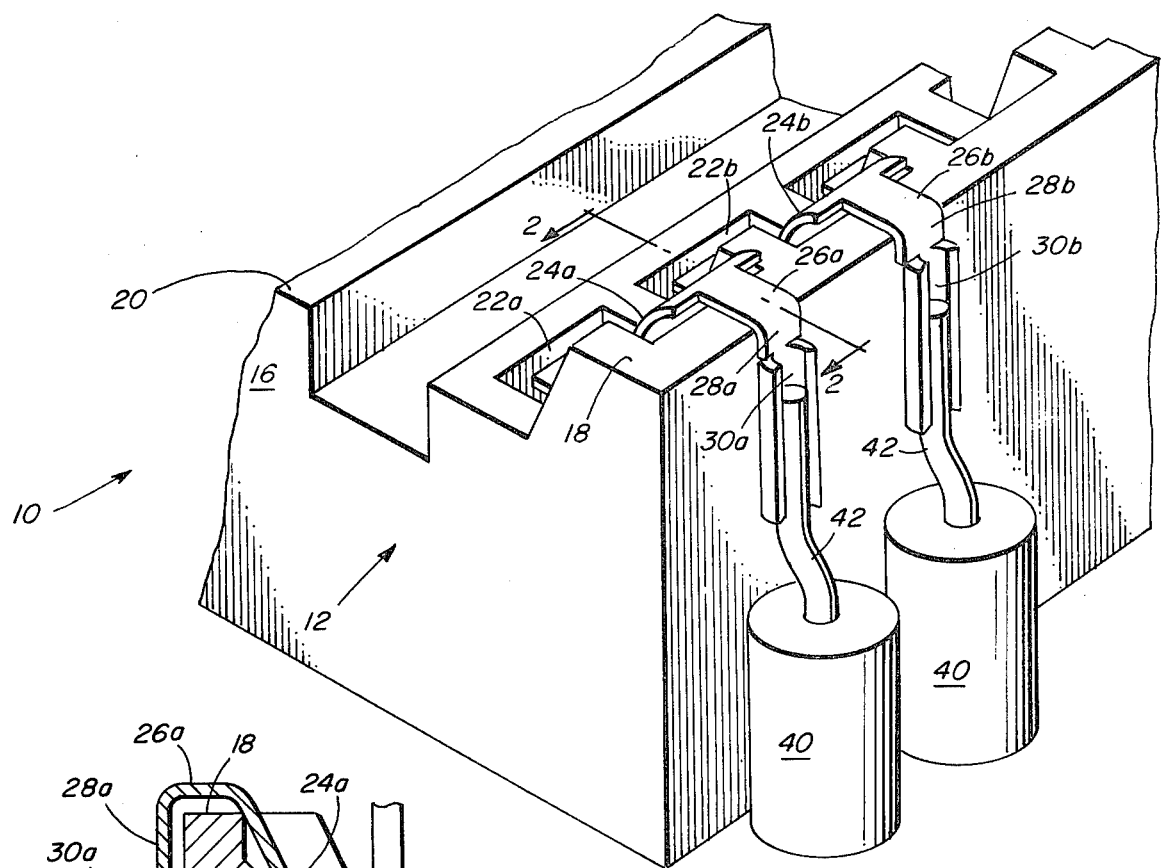
FIG. 1 is a fragmentary perspective illustration of a dip burn-in socket embodying the invention.

FIG. 1 is a perspective view of a dip burn-in socket 10 embodying the preferred invention. The socket 10 comprises a body 12 having outer walls 14 and 16, each of the outer walls having upper edges 18 and 20, respectively. Each of the sockets comprise a plurality of box-shaped compartments 22a, 22b, etc., within which are received the ribbon-like contacts 24a, 24b, etc. The walls of these compartments restrain lateral movement of the contacts as seen most clearly in FIGS. 2 and 3.

Figure 2:
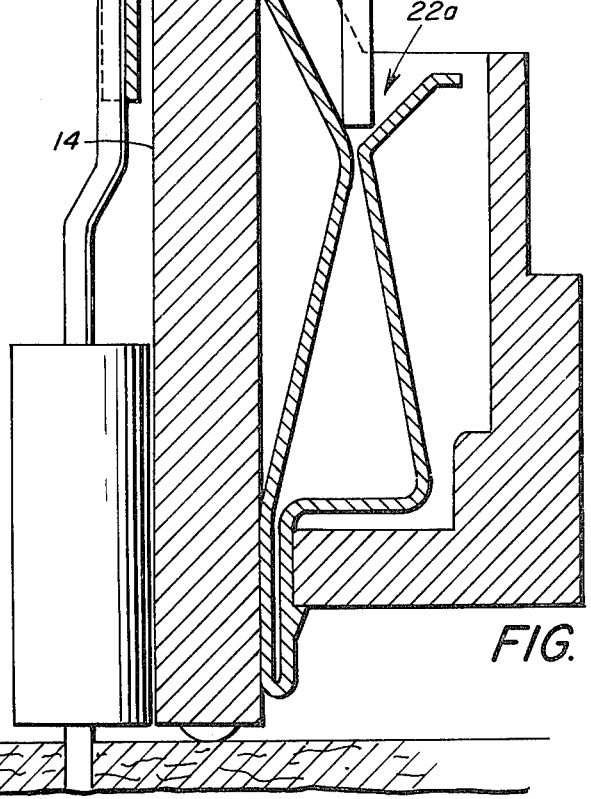
FIG. 2 is a side elevation of FIG. 1 taken along lines 2—2.

Referring to FIG. 2, a sectional view of the socket 10 taken along line 2—2 illustrates the contact 24a biased to a closed position to receive the lead of an IC to be tested. The contact 24a extends upwardly toward the upper edge of the wall 18, turns outwardly and then downwardly forming necked portion 26a seen most clearly in FIGS. 1 and 3. This necked portion 26a terminates in a depending end 28a having a concave inner surface 30a. A resistor 40 including one associated lead 42 is received in the concave surface 28a; the other associated lead is received in the PC board. The surface may be formed such that the lead is frictionally engaged and thereby connected to the contact. However, preferably, it is desired to solder the resistor lead to the connector.

Figure 3:
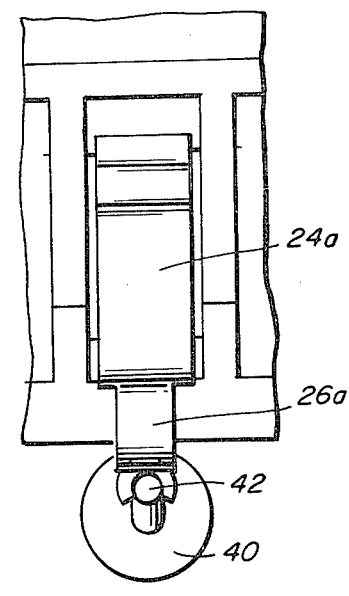
FIG. 3 is a partial plan fragmentary top view of FIG. 1.

Referring to FIGS. 1 and 3, it can be seen that the reduction in width of the contact external to the socket body, i.e. the necked portion 26 and the depending end 28, is approximately one-half.

Therefore, with the present invention when contacts are accidently struck or dislodged, the enhanced spacing between the contacts in this side-by-side relationship overcomes the problems of damage and/or shorting out of the contacts which requires the replacement of a socket.

Other modifications to my invention such as the depending end formed as a sleeve, the necked portion and end all being U-shaped or being entirely a sleeve, etc. are within the scope of my invention.

Having described my invention, what I now claim is:
1. In a burn-in tray having a plurality of dip burn-in sockets arrayed thereon, the sockets having ribbon-like contacts in side-by-side relationship received therein and extending externally of the socket body, resistors secured to the contacts external of said sockets, the improvement which comprises:

The contacts having a first larger width within the socket body, the contacts extending externally of the socket body formed into a necked portion of a second width narrower than the first width, the contact terminating in a depending end of a third width narrower than the first width which end is adapted to receive the lead of a resistor; and wherein the socket body includes outer walls each having upper edges, the necked portion extends across the upper edge and then downwardly.

2. The sockets of claim 1 wherein the depending end extends downwardly and includes a concave surface to engage the resistor lead.

3. The sockets of claim 2 wherein the depending end is arcuate shaped.

4. The sockets of claim 2 wherein the width of the necked portion and the width of the depending end are substantially equal.

* * * * *